(12) United States Patent
Shintomi

(10) Patent No.: US 8,239,745 B2
(45) Date of Patent: Aug. 7, 2012

(54) PARITY DATA ENCODER FOR SERIAL COMMUNICATION

(75) Inventor: Yuji Shintomi, Tomiya (JP)

(73) Assignee: Freescale Semiconductor, Inc., Austin, TX (US)

( * ) Notice: Subject to any disclaimer, the term of this patent is extended or adjusted under 35 U.S.C. 154(b) by 573 days.

(21) Appl. No.: 12/476,266

(22) Filed: Jun. 2, 2009

(65) Prior Publication Data

US 2010/0306633 A1   Dec. 2, 2010

(51) Int. Cl.
*G06F 11/00* (2006.01)
(52) U.S. Cl. ....................................... 714/801
(58) Field of Classification Search ................ 714/801
See application file for complete search history.

(56) References Cited

U.S. PATENT DOCUMENTS

| | | | | |
|---|---|---|---|---|
| 3,727,192 A | * | 4/1973 | Cheney et al. | 370/360 |
| 4,430,737 A | * | 2/1984 | Beranger et al. | 714/801 |
| 4,979,185 A | | 12/1990 | Bryans et al. | |
| 5,608,713 A | * | 3/1997 | Akagiri et al. | 369/124.08 |
| 5,778,007 A | | 7/1998 | Thomann et al. | |
| 7,062,702 B2 | | 6/2006 | Jacobson | |
| 2008/0208939 A1 | * | 8/2008 | Miyazaki et al. | 708/208 |
| 2008/0235556 A1 | | 9/2008 | Eleftheriou et al. | |
| 2009/0089642 A1 | | 4/2009 | Miles et al. | |

FOREIGN PATENT DOCUMENTS

JP   08050553 A   2/1996

* cited by examiner

*Primary Examiner* — Albert Decady
*Assistant Examiner* — Enam Ahmed
(74) *Attorney, Agent, or Firm* — Charles Bergere

(57) ABSTRACT

A prepended parity data encoder is loaded with sets of data and constant data, which are used for parity calculation. A shift circuit shifts each of the plural sets of data and the constant data, one bit at a time in parallel. When the constant data is output from the shift circuit, a parity generator dynamically generates prepended parity data based on the constant data and the plural sets of data.

17 Claims, 3 Drawing Sheets

PARITY DATA ENCODER FOR SERIAL COMMUNICATION

BACKGROUND OF THE INVENTION

The present disclosure is related to an encoder for generating parity data and, more particularly, to an encoder for generating parity data that is prepended to data and serially transmitted.

In digital data serial communication systems, parity data normally is appended to transmission data. The parity data is used to detect transmission errors.

When a data stream including N sets of data is transmitted from a transmitter, every one of the N sets of data is necessary to calculate parity. Accordingly, when appending parity data to the data, the transmitter dynamically calculates the parity data while sequentially transmitting data. In this case, a receiver first receives the N sets of data and then receives the appended parity data, which were generated based on the N sets of data. Thus, the parity data is not received until all of the N sets of data have been received. Accordingly, after receiving all of the data, an error check using the parity data is performed. Thus, when using appended parity data, a communication error cannot be detected at an early stage.

To cope with this problem, parity data may be prepended to the N sets of data that are to be transmitted. Then, for example, if a short circuit occurs in a communication line and produces an error in which all of the received data is fixed to 0 or 1, the use of prepended parity data would enable the receiver to detect such an erroneous state during an initial period of the communication. Thus, it would be advantageous to have an encoder that generates prepended parity data.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
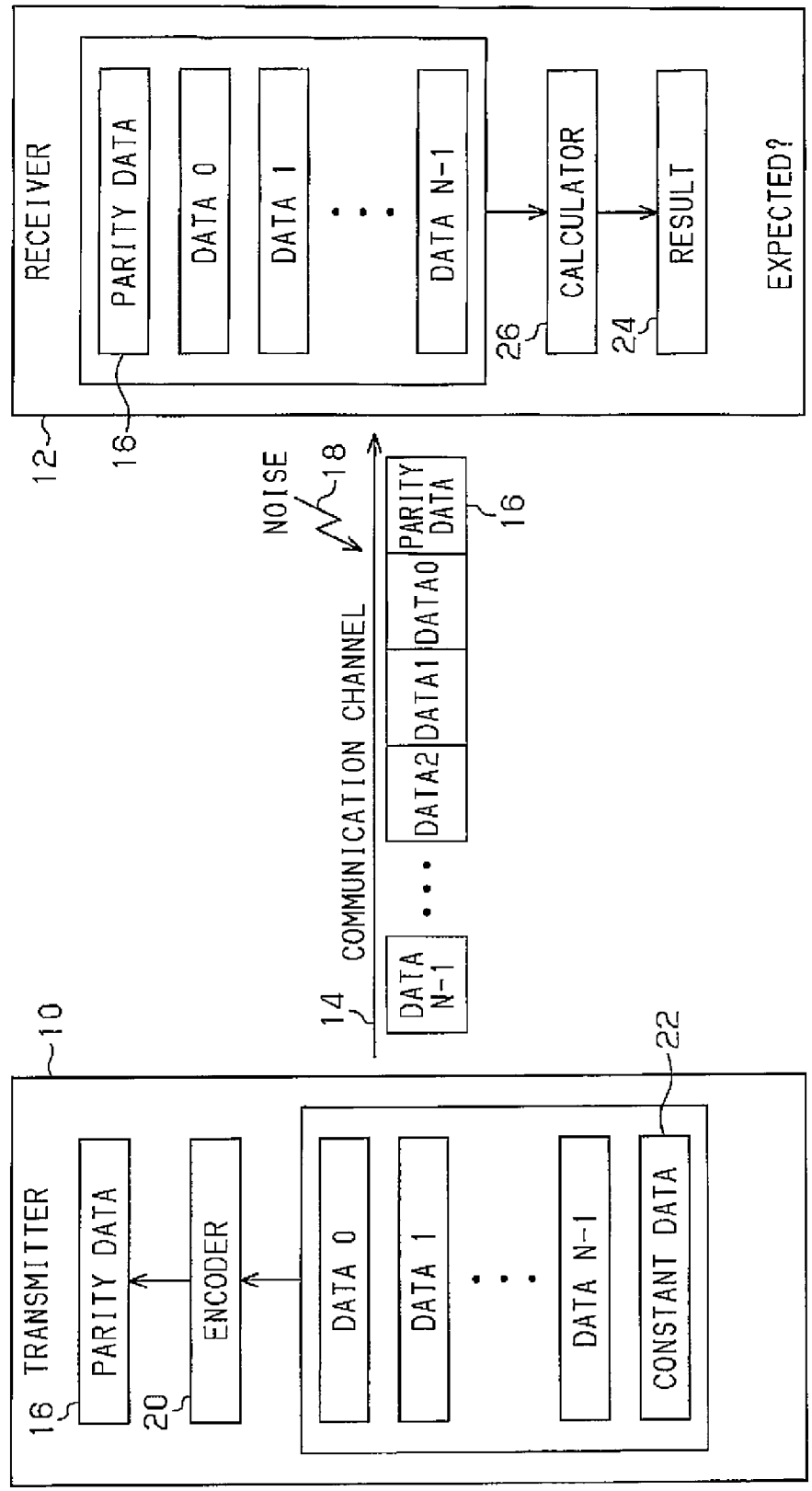
FIG. 1 is a schematic block diagram of a serial communication system.

In the drawings, like numerals are used for like elements throughout. The present invention provides a logic circuit that generates prepended parity bits.

In one embodiment, the present invention is an encoder that includes a shift circuit that is loaded with plural sets of data, and constant data that is used for parity calculation. The shift circuit shifts each of the plural sets of data and the constant data one bit at a time in parallel. A parity generator dynamically generates, based on the constant data and the plural sets of data, parity data that is prepended to the plural sets of data when the constant data is output from the shift circuit.

A further aspect of the present invention is an encoder that includes a data shifter that is loaded with plural sets of data. The data shifter shifts each of the plural sets of data one bit at a time in parallel. An extended shifter is loaded with constant data used for parity calculation. The extended shifter sequentially shifts the constant data and the plural sets of data, which are output from the data shifter, one bit at a time. A parity generator dynamically generates, based on the constant data and the plural sets of data, parity data that is prepended to the plural sets of data when the constant data is being shift-output from the extended shifter. An output selection circuit is connected to the parity generator and the extended shifter. The output selection circuit selectively outputs the prepended parity data, and the shift data output from the extended circuit.

Another aspect of the present invention is a method for transmitting a data stream including prepended parity data. The method includes shifting constant data for parity calculation one bit at a time and outputting the constant data as shift data, shifting each of plural sets of data one bit at a time in parallel with the shifting of the constant data to output plural sets of data as the shift data after the constant data, dynamically generating prepended parity data based on the constant data and the plural sets of data when the constant data is being output as the shift data, and transmitting the data stream including the prepended parity data and the following plural sets of data to a serial communication channel.

Other aspects and advantages of the present invention will become apparent from the following description, taken in conjunction with the accompanying drawings, illustrating by way of example the principles of the invention.

A communication system, which employs one embodiment of a parity encoder 20 in accordance with the present invention, will now be discussed. FIG. 1 schematically illustrates serial communication performed, for example, in an electronic device. A transmitter 10 prepends parity data 16 to N sets of data 0 to N−1, which form a data stream to be transmitted. Then, the transmitter 10 transmits the data stream serially over a communication channel 14. When transmitting the data 0 to N−1, the transmitter 10 generates the parity data 16 for the data 0 to N−1. Then, the transmitter 10 first transmits the parity data 16 over the communication channel 14 and sequentially transmits the N sets of data from data 0 to data N−1 afterwards.

The transmitter 10 includes the encoder 20, which functions as a parity generator for generating the parity data 16. The encoder 20 comprises an integrated circuit (IC) formed with random logic gates. In one embodiment, the encoder 20 uses constant data 22 to generate the parity data 16 for the N sets of data 0 to N−1. For example, when each of the N sets of data includes M bits, the constant data 22 also will include M bits. The constant data 22 is set to a value that is in accordance with a calculation equation for the parity data 16 (e.g., even parity calculation or odd parity calculation) and/or the type of the communication channel 14 (i.e., communication protocol). For example, the constant data may be "00000000" or "0Fh" (in which h expresses a hexadecimal numeral). The constant data 22 is combined with the N sets of data to generate the desired parity data 16.

The receiver 12 receives the data stream transmitted from the transmitter 10 via the communication channel 14. Since the parity data 16 is transmitted by the transmitter 10 first, the receiver 12 receives the parity data 16 and then sequentially receives the data 0 to data N−1 afterwards.

The receiver 12 includes a calculator 26, which functions as an error detector for checking the received data for errors. For example, when the receiver 12 is in the process of receiving a data stream, a communication error (data corruption) may occur if noise 18 is mixed with the data in the communication channel 14. The calculator 26 dynamically performs calculation with the N sets of data sequentially received via the channel 14 and determines whether or not each bit of the received data, or a parity check result 24, is the same as an expected value (not shown). If the result 24 and the expected value are the same, the calculator 26 determines that the received data (here, the N sets of data) is free from errors and thus outputs the received data to an internal circuit (not shown) of the receiver 12. The calculator 26 of the receiver 12 may be a microprocessor, which uses software to perform parity checks. Alternatively, the calculator 26 may be hardware, which uses random logic gates or the like.

Figure 2:
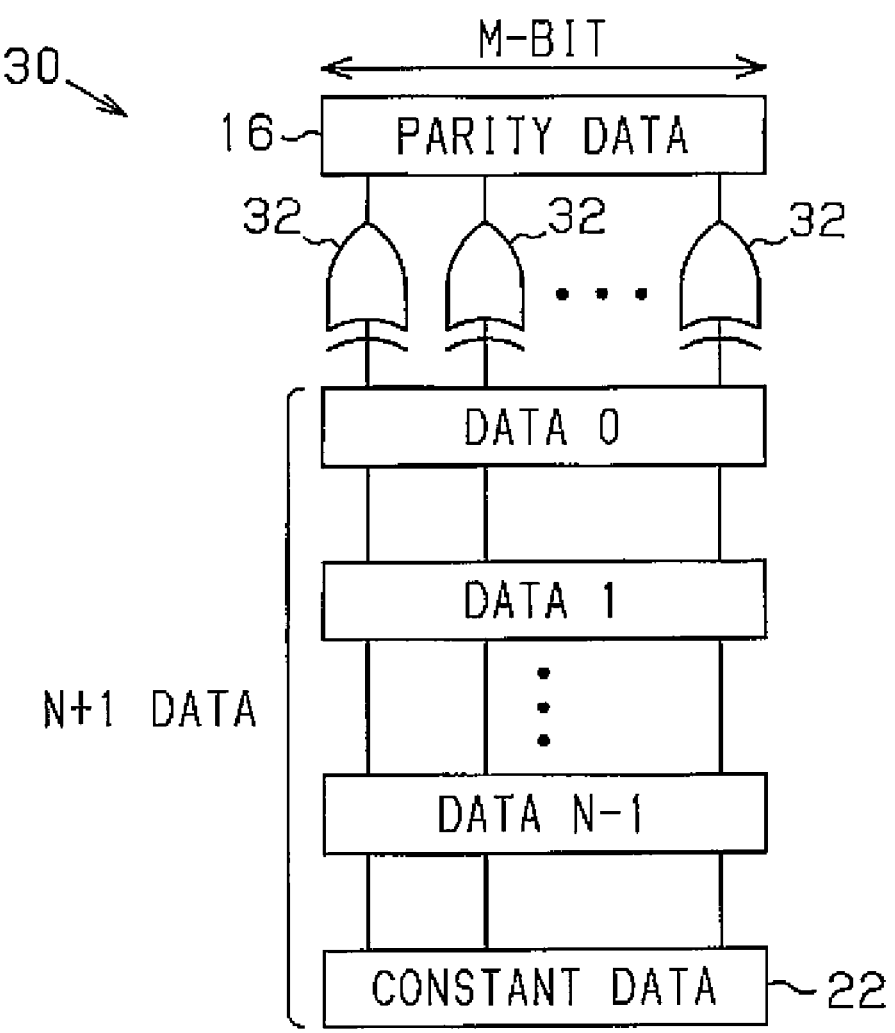
FIG. 2 is a more detailed schematic diagram of a parity encoder in accordance with an embodiment of the present invention.

Referring now to FIG. 2, one example of a circuit formed with random logic gates (parity encoder 30) that realizes the encoder 20 of the transmitter 10 shown in FIG. 1, is shown. The parity encoder 30, which functions as a parity generator, includes a plurality of exclusive OR gates (hereinafter XOR gates) 32 in correspondence with the data length of each of the data 0 to N−1 and the constant data 22. Here, for example, each of the data 0 to N−1 includes M bits, and the constant data 22 also includes M bits. Therefore, the encoder 30 includes M XOR gates 32. The M XOR gates 32 use the data 0 to N−1 and the constant data 22 to generate the parity data 16, which includes M bits from the least significant bit (LSB) to the most significant bit (MSB).

Each XOR gate 32 is, for example, formed by an XOR gate including (N+1) inputs. The XOR gate 32 receives bits (e.g., the LSB of each data) selected from each of the data 0 to N−1 and the constant data 22 one bit at a time and performs an XOR with N+1 bits in total. In this case, the parity encoder 30 includes M XOR gates.

However, in an actual circuit, an (N+1)-input XOR gate is not formed by a single XOR gate. For example, when using an XOR gate having two inputs, a single (N+1)-input XOR gate is formed by N two-input XOR gates. Accordingly, in the encoder structure of FIG. 2, the encoder 30 needs M×N two-input XOR gates, which corresponds with the data length (M).

In one example, a single data frame, which is transmitted and received via serial communication, includes twelve sets of data (i.e., N=12), each having a data length of two bytes (i.e., M=16). In this case, the parity encoder 30 combines the twelve sets of data with two bytes of the constant data 22 to generate two bytes of parity data 16. To form the encoder 30 with the structure shown in FIG. 2, a total number of (16×12) two-input XOR gates is necessary. A typical XOR gate requires many transistors and thus occupies a relatively large chip area. Thus, when implementing a serial communication protocol that uses prepended parity data, it is desirable to reduce the size of the circuit that forms the encoder 30 having the structure shown in FIG. 2.

To decrease the number of elements in the logic circuit and reduce the size (area) of the parity encoder, the present invention provides a parity encoder that dynamically generates prepended parity data with a logic circuit.

Figure 3:
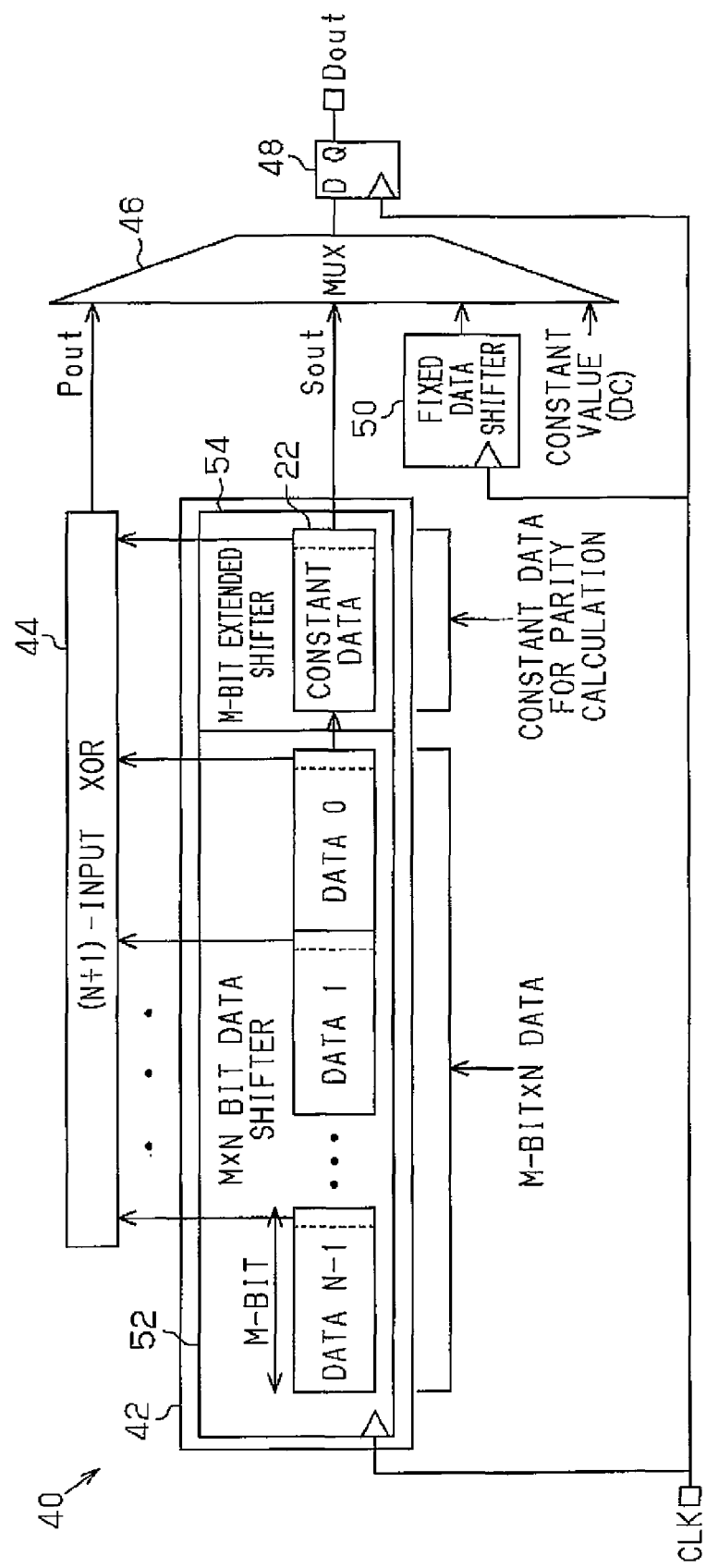
FIG. 3 is a schematic circuit diagram of a parity encoder formed with random logic gates.

Referring now to FIG. 3, a parity encoder 40 in accordance with another embodiment of the present invention in shown. The parity encoder 40 includes a shift circuit 42, a parity generator 44, and a multiplexer (hereinafter referred to as the "MUX") 46, which functions as an output selection circuit.

The shift circuit 42 is loaded in advance with N sets of data (each having M bits), which are included in a single data frame, and constant data 22 (M bits), which is in accordance with a predetermined parity equation. The shift circuit 42 shifts each of the data 0 to N−1 and the constant data 22 one bit at a time, in parallel, in accordance with a serial clock CLK. As a result, shift data Sout is shifted out from the shift circuit 42 bit by bit to the MUX 46.

Further, in accordance with the serial clock CLK, the shift circuit 42 provides the parity generator 44 with each of the data 0 to N−1 and the constant data 22 one bit at a time in parallel from the LSB to the MSB. Accordingly, while performing data shifting and providing the MUX 46 with the shift data Sout, the shift circuit 42 simultaneously provides the parity generator 44 with a plurality of bits (i.e., N+1 bits for each clock cycle) extracted one bit at a time in parallel from each of the data 0 to N−1 and constant data 22. In this case, the data shifting performed with the shift circuit 42 continues until the shift circuit 42 has output all of the constant data 22 and N sets of data. In the shift circuit 42, when the M bits of constant data 22 have all been provided from the shift circuit 42 to the parity generator 44, the N sets of data have also all been provided to the parity generator 44.

The shift circuit 42 includes a data shifter 52, which is loaded with the N sets of data (M bits×N), and an extended shifter 54, which is loaded with the constant data 22 (M bits). The data shifter 52 and the extended shifter 54 are clocked with the serial clock CLK.

The extended shifter 54 is arranged between the data shifter 52 and the MUX 46 so that the constant data 22 (specifically, the LSB of the constant data 22) is output first from the extended shifter 54. The extended shifter 54 shifts data one bit at a time in accordance with the serial clock CLK.

The data shifter 52 is loaded with data 0 to N−1 in the order the data stream is transmitted over the channel 14. The data shifter 52 shifts each of the data 0 to N−1 one bit at a time, in parallel, in accordance with the serial clock CLK. The bit data shifted out from the data shifter 52 is provided to the MUX 46 via the extended shifter 54. Accordingly, the shift circuit 42 outputs the data 0 (specifically, the LSB of the data 0) after the constant data 22. Then, the shift circuit 42 outputs the data 1 to N−1. For example, the LSB of the data 0, which has been transferred from the data shifter 52 to the extended shifter 54, first undergoes data shifting by M bits in the extended shifter 54 and is then output to the MUX 46 from the extended shifter 54.

Based on the N+1 bits selected in a single clock cycle, the parity generator 44 generates part of the parity data 16 as a parity bit Pout. In other words, to generate the single parity bit Pout, N+1 bits, which are extracted one bit at a time in parallel from each of the data 0 to N−1 and constant data 22, are all used. Accordingly, the parity data 16 (i.e., M bits of parity Pout) is generated using all of the N sets of data and the constant data 22.

The parity generator 44 dynamically generates the parity data 16 in synchronism with the timing at which the shift circuit 42 extracts the N+1 bits in each clock cycle. Accordingly, the parity generator 44 also operates in synchronism with the serial clock CLK. As a result, during the period in which the constant data 22 (M bits of shift data Sout) is output from the shift circuit 42, the parity generator 44 outputs the parity data 16 (M bits of parity Pout). In other words, while shifting out the shift data Sout from the shift circuit 42 and transmitting the data 0 to N−1 (data stream formation), the encoder 40 dynamically generates the parity data 16 with the parity generator 44. The extended shifter 54 first outputs the constant data 22 as the shift data Sout. Thus, the data 0 to N−1 is shifted out with a delay corresponding to M bits from the output of the constant data 22. Due to this delay, the encoder 40 dynamically generates the parity data 16 without having to suspend or delay shifting of the data. Accordingly, the shift circuit 42 of the encoder 40 is suitable for the generation of the parity data 16 that is prepended to the data 0 to N−1.

The parity generator 44 is formed, for example, by an XOR gate having N+1 inputs. The (N+1) input XOR gate receives bits selected from each of the data 0 to N−1 and the constant data 22 one bit at a time in parallel and thus XORs N+1 bits in total. In this case, the parity generator 44 includes a single (N+1)-input XOR circuit that is not dependent on the data length M.

If 2-input XOR gates were used to form the (N+1)-input XOR circuit, the parity generator 44 would be formed with N two-input XOR gates. That is, for the encoder structure shown in FIG. 3, only N 2-input XOR gates are necessary for the entire encoder 40. This decreases the number of XOR gates to 1/M as compared to the encoder 30 shown in FIG. 2. Accordingly, the number of transistors is drastically reduced. Although not shown in FIG. 2, a shift circuit (the structure of which differs from that of FIG. 3) and MUX would also be necessary in the structure of FIG. 2.

When the shift data Dout is shifted out from the shift circuit 42, the MUX 46 selectively outputs the shift data Dout and the parity Pout. Accordingly, the MUX 46 outputs data in synchronism with the serial clock CLK. The MUX may be directly provided with the serial clock CLK. More specifically, the MUX 46 first selects the parity data 16 (M bits of parity Pout) output from the parity generator 44 and then selects the data 0 to N−1 (M bits×N of data Sout).

The encoder 40 may optionally include a fixed data shifter 50, which operates in accordance with the serial clock CLK. The fixed data shifter 50 is used to provide, for example, header data (e.g., M bits) for a device ID or the like. In this case, the MUX 46 selects the parity data 16 (M bits of parity Pout) after the header data output from the fixed data shifter 50 and then selects the data Sout. Further, the encoder 40 may optionally include an input terminal for receiving a constant DC value. The constant DC value is, for example, "0" and used to set any data bit to "0" in accordance with the communication protocol being used.

The MUX 46 has an output terminal connected to an output circuit 48. The output circuit 48 is, for example, a D flip-flop (DFF) and outputs the output data of the MUX 46 as transmission data in synchronism with the serial clock CLK.

The parity encoder 40 has the following advantages. When the constant data 22 is being output from the shift circuit 42 (preferably, the extended shifter 54), the encoder 40 dynamically generates the parity data 16 (prepended parity data) based on the constant data 22 and data 0 to N−1. Accordingly, the encoder 40 is ideal for a communication protocol that uses prepended parity data.

The shift circuit 42 includes the extended shifter 54, which outputs the constant data 22 before outputting the data 0 to N−1. Thus, after transmitting the parity data 16 in correspondence with the data length (M) of the constant data 22, the encoder 40 transmits the data 0 to N−1 without any delays.

The parity generator 44 may comprise a single (N+1)-input XOR circuit that is not dependent on the data length (M) of each of the data 0 to N−1 and constant data 22. This reduces the number of XOR gates for the parity generator 44. For example, the parity generator 44 may be formed with N two-input XOR gates that are not dependent on the data length (M). Accordingly, the number of XOR gates is decreased to 1/M compared to that of the encoder structure (parity generator) shown in FIG. 2. This provides a highly practical device that generates the prepended parity data 16 with a logic circuit.

It should be apparent to those skilled in the art that the present invention may be embodied in many other specific forms without departing from the spirit or scope of the invention. Particularly, it should be understood that the present invention may be embodied in the following forms.

The shift circuit 42 does not have to be functionally divided into the data shifter 52 and the extended shifter 54. Further, the parity generator 44 is not limited to the use of N two-input XOR gates. Multi-input XOR gates other than two-input XOR gates may be used.

The present examples and embodiments are to be considered as illustrative and not restrictive, and the invention is not to be limited to the details given herein, but may be modified within the scope and equivalence of the appended claims.

What is claimed is:

1. An encoder, comprising:
    a shift circuit that is loaded with plural sets of data and constant data, which are used for parity calculation, wherein the shift circuit shifts each of the plural sets of data and the constant data one bit at a time in parallel; and
    a parity generator, connected to the shift circuit, that dynamically generates, based on the constant data and the plural sets of data, prepended parity data that is attached to the plural sets of data when the constant data is shifted out of the shift circuit, wherein the shift circuit includes:
    a data shifter that is loaded with and outputs the plural sets of data; and
    an extended shifter, connected to the data shifter, that is loaded with the constant data and sequentially outputs the constant data and the plural sets of data output from the data shifter.

2. The encoder of claim 1, wherein the shift circuit first shifts and outputs the constant data and then shifts and outputs the plural sets of data.

3. The encoder of claim 1, wherein the parity generator generates part of the prepended parity data using a plurality of bits extracted one bit at a time, in parallel, from each of the plural sets of data and the constant data when one of M bits of the constant data is being output from the shift circuit.

4. The encoder of claim 1, wherein the parity generator comprises an XOR circuit.

5. The encoder of claim 4, wherein the plural sets of data include N sets of data and the XOR circuit is formed using N two-input XOR gates.

6. The encoder of claim 1, further comprising an output selection circuit that selectively outputs shift data output from the shift circuit and the prepended parity data generated by the parity generator.

7. The encoder of claim 6, wherein the output selection circuit selects the prepended parity data when the constant data is being output from the shift circuit as the shift data.

8. The encoder of claim 6, wherein the shift circuit, the parity generator, and the output selection circuit are operated in synchronism with a clock.

9. The encoder of claim 6, further comprising a fixed data shifter that is loaded with header data, connected to the output selection circuit, wherein the output selection circuit selectively outputs the header data, the shift data, and the prepended parity data.

10. The encoder of claim 1,
    wherein the extended shifter shifts and outputs the constant data one bit at a time and, after the constant data, shifts and outputs bit data that is sequentially output from the data shifter one bit at a time.

11. The encoder of claim 10, further comprising:
    an output selection circuit connected to the parity generator and the extended shifter, wherein the extended shifter is arranged between the data shifter and the output selection circuit.

12. The encoder of claim 11, wherein the extended shifter, the parity generator, and the output selection circuit operate in synchronism with a clock.

13. The encoder of claim 10, wherein the parity generator comprises an XOR circuit.

14. The encoder of claim 13, wherein the plural sets of data include N sets of data and the XOR circuit is formed using N two-input XOR gates.

15. An encoder, comprising:
- a data shifter that is loaded with plural sets of data, wherein the data shifter shifts each of the plural sets of data one bit at a time in parallel;
- an extended shifter, connected to the data shifter, that is loaded with constant data used for parity calculation, wherein the extended shifter sequentially shifts the constant data and the plural sets of data output from the data shifter, one bit at a time;
- a parity generator, connected to the data shifter and the extended shifter, that dynamically generates, based on the constant data and the plural sets of data, prepended parity data; and
- an output selection circuit connected to the parity generator and the extended shifter, wherein the output selection circuit selectively outputs the prepended parity data generated by the parity generator, and the shift data that is output from the extended circuit.

16. The encoder of claim 15, further comprising a fixed data shifter connected to the output selection circuit, wherein the fixed data shifter is loaded with header data, and the output selection circuit selectively outputs the header data, the shift data, and the prepended parity data.

17. The encoder of claim 15, wherein the output selection circuit further includes a constant value input for selectively outputting said constant value, thereby selectively setting any bit output by the output selection circuit to said constant value.

* * * * *